(12) United States Patent
Schuegraf et al.

(10) Patent No.: US 7,009,264 B1
(45) Date of Patent: Mar. 7, 2006

(54) SELECTIVE SPACER TO PREVENT METAL OXIDE FORMATION DURING POLYCIDE REOXIDATION

(75) Inventors: Klaus Florian Schuegraf, Tempe, AZ (US); Scott Jeffrey DeBoer, Boise, ID (US); Randhir P. S. Thakur, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 942 days.

(21) Appl. No.: 08/902,809

(22) Filed: Jul. 30, 1997

(Under 37 CFR 1.47)

(51) Int. Cl.
*H01L 29/76* (2006.01)

(52) U.S. Cl. .................. 257/408; 257/344; 257/900

(58) Field of Classification Search ............. 257/344, 257/408; 438/302, 303, 304, 305, 595, 596
See application file for complete search history.

(56) References Cited

U.S. PATENT DOCUMENTS

| | | | | |
|---|---|---|---|---|
| 4,711,701 A | * | 12/1987 | McLevige | 437/41 |
| 4,774,201 A | | 9/1988 | Woo et al. | |
| 5,032,530 A | * | 7/1991 | Lowrey et al. | 437/34 |
| 5,087,584 A | | 2/1992 | Wada et al. | 437/43 |
| 5,103,272 A | | 4/1992 | Nishiyama | 357/23.4 |
| 5,146,291 A | * | 9/1992 | Watabe et al. | 357/23.4 |
| 5,175,606 A | * | 12/1992 | Tsai et al. | 257/320 |
| 5,235,204 A | * | 8/1993 | Tsai | 257/408 |
| 5,268,330 A | | 12/1993 | Givens et al. | 437/195 |
| 5,272,367 A | * | 12/1993 | Dennison et al. | 257/306 |
| 5,364,804 A | * | 11/1994 | Ho et al. | 438/592 |
| 5,371,026 A | | 12/1994 | Hayden et al. | 437/41 |
| 5,382,551 A | | 1/1995 | Thakur et al. | 437/247 |
| 5,397,722 A | | 3/1995 | Bashir et al. | 437/41 |
| 5,422,291 A | | 6/1995 | Clementi et al. | 437/43 |
| 5,425,392 A | | 6/1995 | Thakur et al. | 437/173 |
| 5,438,016 A | | 8/1995 | Figura et al. | 437/67 |
| 5,439,838 A | | 8/1995 | Yang | 437/43 |

(Continued)

OTHER PUBLICATIONS

Beyers, R., "Thermodynamic Considerations in Refractory Metal Silicon–Oxygen Systems", *J. Appl. Phys.*, 56, 147–152, (Jul. 1984).

Kasai, K., et al., "W/WNx/Poly–Si Gate Technology for Future High Speed Deep Submicron CMOS LSIs", *International Electron Devices Meeting*, 497–500, (1994).

Lee, D.H., et al., "Gate Oxide Integrity (GOI) of MOS transistors with W/TiN stacked gate", *1996 Symposium on VLSI Technology Digest of Technical Papers*, 208–209, (1996).

Glasser, Lance A., et al., "The Design and Analysis of VLSI Circuits", (1985), pp. 100–103, 176–179, 182–183.

Weste, Neil H., "Principles of CMOS VLSI Design—a systems perspective", Addison–Wesley pbulishing company, 2nd ed., AT&T,(1993), pp. 71–72.

*Primary Examiner*—Ori Nadav
(74) *Attorney, Agent, or Firm*—Schwegman, Lundberg, Woessner & Kluth, P.A.

(57) ABSTRACT

A selective spacer to prevent metal oxide formation during polycide reoxidation of a feature such as an electrode and a method for forming the selective spacer are disclosed. A material such as a thin silicon nitride or an amorphous silicon film is selectively deposited on the electrode by limiting deposition time to a period less than an incubation time for the material on silicon dioxide near the electrode. The spacer is deposited only on the electrode and not on surrounding silicon dioxide. The spacer serves as a barrier for the electrode during subsequent oxidation to prevent metal oxide formation while allowing oxidation to take place over the silicon dioxide.

22 Claims, 2 Drawing Sheets

U.S. PATENT DOCUMENTS

| | | | |
|---|---|---|---|
| 5,459,345 A | * 10/1995 | Okudaira et al. | 257/310 |
| 5,468,665 A | * 11/1995 | Lee et al. | 437/44 |
| 5,480,830 A | * 1/1996 | Liao et al. | 438/199 |
| 5,526,306 A | 6/1996 | Hikawa et al. | 365/182 |
| 5,538,906 A | 7/1996 | Aoki | 437/29 |
| 5,545,578 A | * 8/1996 | Park et al. | 438/303 |
| 5,583,368 A | * 12/1996 | Kenney | 257/621 |
| 5,597,756 A | 1/1997 | Fazan et al. | 437/52 |
| 5,608,249 A | * 3/1997 | Gonzalez | 257/306 |
| 5,624,865 A | 4/1997 | Schuegraf et al. | 438/396 |
| 5,668,394 A | 9/1997 | Lur et al. | 257/413 |
| 5,681,768 A | 10/1997 | Smayling et al. | 437/41 |
| 5,707,898 A | * 1/1998 | Keller et al. | 438/265 |
| 5,739,066 A | 4/1998 | Pan | 438/595 |
| 5,796,151 A | * 8/1998 | Hsu et al. | 257/410 |
| 5,804,838 A | * 9/1998 | Manning | 257/72 |
| 5,925,918 A | 7/1999 | Wu et al. | 257/413 |
| 5,929,494 A | 7/1999 | Li | 257/390 |
| 5,998,290 A | 12/1999 | Wu et al. | 438/595 |
| 6,075,274 A | 6/2000 | Wu et al. | 257/413 |
| 6,350,708 B1 | 2/2002 | Hurley | |

* cited by examiner

SELECTIVE SPACER TO PREVENT METAL OXIDE FORMATION DURING POLYCIDE REOXIDATION

FIELD OF THE INVENTION

The present invention relates in general to fabricating semiconductor devices, and particularly to controlling oxide formation during reoxidation.

BACKGROUND OF THE INVENTION

Advancing technology continues to pressure manufacturers to produce complementary metal-oxide semiconductor (CMOS) devices with both greater capacities and smaller profiles. To counteract the resulting parasitic effects caused by resistance/capacitance delays in gate electrodes in such down-scaled devices, there is a continual quest for new combinations of materials from which to fabricate gate structures. For example, in *W/WNx/Poly-Si Gate Technology for Future High Speed Deep Submicron CMOS LSIs*, 497–500 IEDM 1994, K. Kasai et al. describe a structure comprising tungsten, tungsten nitride and polysilicon (W/WNx/PolySi). This structure has a greatly reduced sheet resistance and enables improved performance of the CMOS device. The structure proposed by Kasai et al. is, however, limited because the structure is only able to withstand temperatures up to 900° C. for 30 seconds or less during rapid thermal annealing. Proper source/drain reoxidation requires temperatures at or above 900° C. for at least fifteen minutes. To date, where the W/WNx/PolySi structure is used, after source/drain reoxidation the wordline profile exhibits a considerable protuberance on the exposed tungsten silicide ($WSi_x$). This complicates subsequent etches, and the undesirable "spacer" implants from the gate edge decrease device performance.

In conventional processing, a conductive gate electrode is patterned into fine features by photo/etch processing. This electrode is subsequently subjected to reoxidation to repair physical damage caused by the etch process in one of two ways: either directly or through a deposited silicon dioxide spacer. For a tungsten silicide feature, this reoxidation results in $SiO_2$ growth on the polysilicon and silicide. Other choices for metal shunt layers of polysilicon include materials such as tungsten, titanium silicide and molybdenum. As described by Robert Beyers in *Thermodynamic considerations in refractory metal silicon-oxygen systems*, 147–52 Journal of Applied Physics 56(1), (July, 1984), these metals, when oxidized, result in unstable metal oxides. This is because, unlike tungsten silicide, there is little or no silicon available for oxidation into $SiO_2$.

As a result, there remains a need to be able to tap the potential of devices manufactured from materials such as tungsten and minire the detrimental effects resulting from the formation of oxide.

SUMMARY OF THE INVENTION

The primary object of the present invention is to eliminate the aforementioned drawbacks of the prior art.

This invention proposes a method for forming an encapsulating spacer for protecting a refractory metal or polycide from fomiing metal oxide formation during gate stack reoxidation. According to one embodiment an encapsulating spacer is formed prior to gate stack reoxidation to prevent undesirable formation of metal oxides during this oxidation process. In another embodiment either a thin silicon nitride or amorphous silicon film is selectively deposited after gate stack patterning over a gate stack without any deposition on the active areas. This selective deposition will result in a thin film of insulating material over the gate stack which will prevent metal oxide formation during polycide (source/drain) reoxidation.

The present invention describes an improvement in the one-spacer approach because it allows source/drain reoxidation after patterning. Conventional processes using tungsten or tungsten nitride experience a "rabbit ear" problem of tungsten reoxidation after any thermal cycle more intensive than rapid thermal annealing performed at temperatures higher than 900° C.

The present invention also describes an improvement in the two-spacer approach, simplifying the double spacer deposition/etch sequence into a sequence comprising two depositions and one etch. Yet another embodiment of the present invention encapsulates refractory metal from uncontrollable oxidation during source/drain reoxidation after gate patterning.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

In conventional processing, reoxidizing a device results in silicon dioxide growth on both polysilicon and silicide features. As mentioned above, this creates an unacceptably deformed wordline profile. According to one embodiment of the present invention, the deformation is minimized by selective spacer formation on the sidewalls of tungsten silicide features. The spacer minimizes oxidation and the subsequent degradation of the feature.

Figure 1:
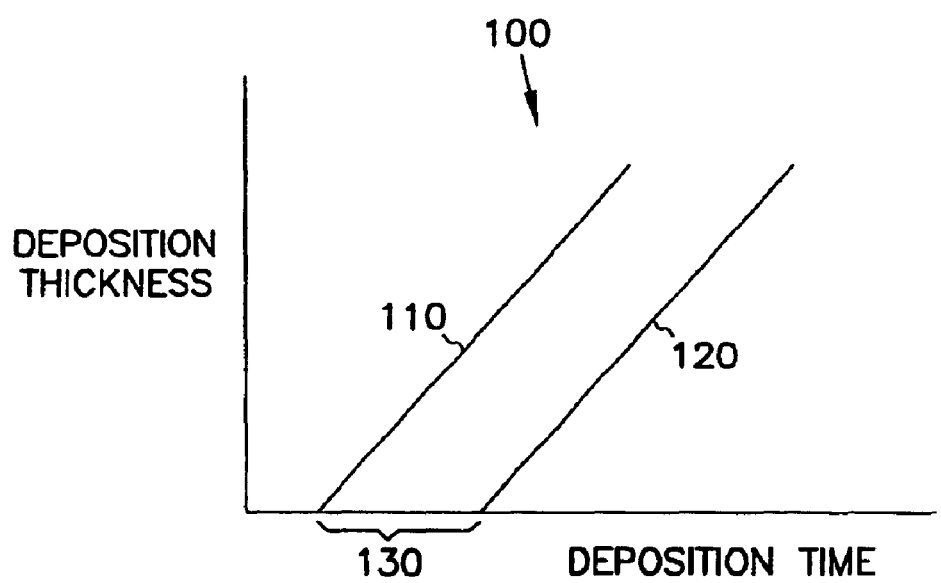
FIG. 1 is a graphic representation of the physical phenomena to be exploited for the selective spacer process.

FIG. 1 provides a graphic representation of the physical phenomena which the selective spacer process employs. The example presented shows that deposition of spacer materials on polysilicon 110 occurs more rapidly than deposition on oxide 120. Those skilled in the art will recognize that other materials may be used in place of polysilicon with similar results. The difference in incubation time 130 on dissimilar materials makes selective spacer deposition possible. For both silicon nitride and undoped polysilicon, deposition parameters (temperature, pressure, flow rates, etc.) can be adjusted to provide a rather wide incubation time difference 130. For example, in one embodiment where $Si_3N_4$ is deposited as the spacer material, a deposition difference as high as 60 Angstroms can be achieved for film deposition on different surfaces (such as silicon dioxide and silicon or polysilicon) using a temperature of 680° C., a pressure of 80 milliTorrs, and a flow ratio of 6:1.

Figure 2A:
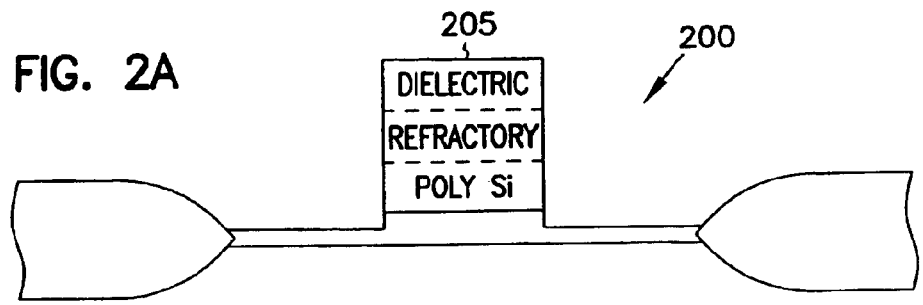
FIG. 2A is a cross-sectional view of a portion of an in-process semiconductor wafer following gate line masking and a subsequent dry etch of the exposed silicon nitride, using the polysilicon layer as the etch stop.
Figure 2B:
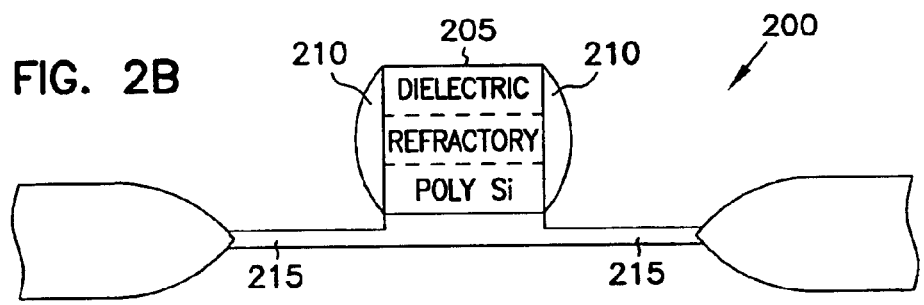
FIG. 2B is a cross-sectional view of the portion of an in-process semiconductor wafer depicted in FIG. 2A following selective spacer deposition according to one embodiment of the present invention.
Figure 2C:
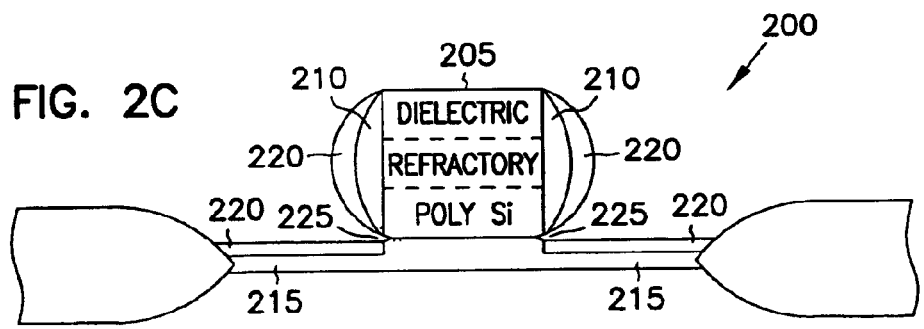
FIG. 2C is a cross-sectional view of the portion of an in-process semiconductor wafer depicted in FIG. 2B following reoxidation.

FIGS. 2A–2D show how this incubation time difference 130 can be exploited for selective spacer deposition, encapsulating refractory metal prior to polycide reoxidation. As shown in FIG. 2A, the first step is patterning an electrode 205 into fine feature. In the embodiment shown in FIG. 2A electrode 205 comprises polysilicon, a refractory metal, and a dielectric. Those skilled in the art will recognize, however, that other materials, such as undoped silicon, may be used to construct electrode 205. In the second step, represented in FIGS. 2B and 2C, a selective spacer 210 is deposited such that the amount deposited on the polysilicon and refractory metal of electrode 205 is less than the incubation thickness, leaving the active area 215 free of deposition. In one embodiment the spacer comprises a thin silicon nitride, while in another it comprises an amorphous silicon film. It is to be noted that the foregoing examples are meant to be illustrative only and not limiting in any fashion.

Figure 2D:
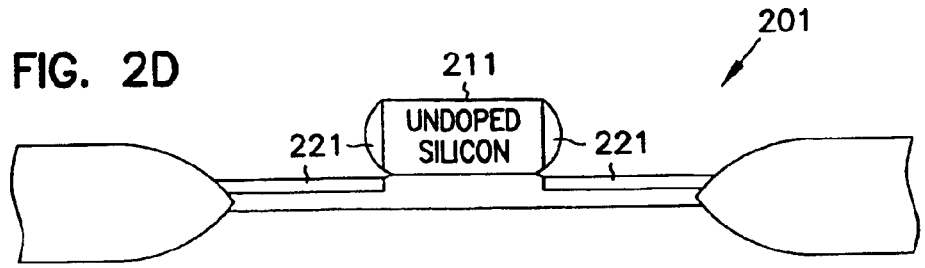
FIG. 2D is a cross-sectional view of a portion of an in-process semiconductor wafer after selective spacer deposition and reoxidation, wherein the gate line is formed of undoped silicon.

Once the spacer is deposited, the device undergoes polycide reoxidation 220. Because the spacer is selectively deposited there is no need for an additional etch step to remove excess spacer material. The oxidation process forms smile 225, and active area 215 and selective spacers 210 are reoxidized 220. As can be seen, the metal portion of electrode 205 is protected by spacers 210 and thus is not subjected to the high temperature oxygen environment. Selective spacer 210 acts as a diffusion barrier preventing oxygen from reaching metal layers of electrode 205. Subsequently, an additional spacer may be deposited to the desired spacer thickness of several hundred angstroms, setting the lateral dimension of the transistor's source/drain diffusion. As shown in FIG. 2D, similar results are obtainable when 205 comprises undoped silicon 211 with reoxidation 221.

The net result is that the additional step of protecting the feature can be performed though modifying process parameters and without adding any further steps to the overall process. The process described enables devices fabricated from materials such as tungsten to be more fully exploited, minimizing detrimental effects resulting from the formation of oxide, and all without increasing the cost or complexity of the fabrication process. For example, if one spacer is desired source/drain reoxidation may be performed after patterning. In contrast, conventional processes (such as the $W/WN_x$ stack described in the paper by Kasai et al.), will show a "rabbit ear" problem of tungsten reoxidation after a thermal cycle.

In a two-spacer approach, the method of the present invention simplifies the double spacer deposition/etch sequence into two deposition and one etch sequence. According to one embodiment, during sourceldrain reoxidation the refractory metal exposed by patterning is encapsulated, protecting the metal from uncontrollable oxidation. In contrast, conventional processing requires a deposition and etch step for each spacer before source/drain oxidation can be performed.

Is it to be recognized that the above description is intended to be illustrative, and not restrictive. Many other embodiments will be apparent to those of skill in the art upon reviewing the above description. The scope of the invention should, therefore, be determiined with reference to the appended claims, along with the full scope of equivalents to which such claims are entitled.

What is claimed is:

1. An electronic device comprising:
a first layer of oxide;
a feature over the first layer of oxide, the feature having a surface;
a boundary between the first layer of oxide and the feature; and
a spacer comprising silicon nitride or an amorphous silicon film only on the surface of the feature.

2. The electronic device of claim 1 wherein the spacer is deposited on the surface of the feature extending to and terminating at the boundary.

3. The electronic device of claim 1 wherein:
the first layer of oxide comprises a layer of gate oxide;
the feature comprises an electrode including polysilicon, a refractory metal, and a dielectric, or undoped silicon; and
the surface of the feature comprises sidewalls of the electrode.

4. An electronic device comprising:
a first layer of oxide;
an electrode on the first layer of oxide, the electrode having sidewalls; and
a spacer comprising silicon nitride or an amorphous silicon film deposited only on the sidewalls of the electrode, the spacer extending to and terminating at a boundary between the first layer of oxide and the sidewalls of the electrode.

5. The electronic device of claim 4 wherein:
the first layer of oxide comprises a layer of gate oxide; and
the electrode comprises polysilicon, a refractory metal, and a dielectric, or undoped silicon.

6. A semiconductor device, comprising:
a first layer of oxide;
a feature protruding from the first layer of oxide and having sidewalls, the feature including:
a polysilicon portion;
a portion of conductive material deposited on the polysilicon portion;
a spacer comprising silicon nitride or an amorphous silicon film selectively deposited only on the sidewalls of the feature; and
a second layer of oxide deposited on the semiconductor device, wherein the spacer is interposed between the second layer of oxide and the sidewalls of the feature.

7. The semiconductor device of claim 6, wherein the portion of conductive material comprises tungsten silicide.

8. A semiconductor device, comprising:
a first layer of oxide;
a feature protruding from the first layer of oxide and having sidewalls, the feature comprising:
a layer of polysilicon;
one or more layers of conductive materials deposited on the layer of polysilicon, wherein at least one of the layers comprises tungsten silicide;

a silicon nitride spacer selectively deposited only on the sidewalls of the feature; and a second layer of oxide deposited on the semiconductor device, wherein the silicon nitride spacer is interposed between the second layer of oxide and the sidewalls of the feature.

9. A gate electrode, comprising:

one or more layers of conductive materials etched to form a feature having sidewalls exposing the layers;

a selectively deposited spacer comprising silicon nitride or an amorphous silicon film, wherein the spacer is deposited only on the sidewalls of the feature; and a layer of oxide disposed over the gate electrode.

10. The gate electrode of claim 9, wherein the layers of conductive materials comprise tungsten silicide.

11. An electronic device comprising:

a first layer of oxide;

an electrode on the first layer of oxide, the electrode having sidewalls; and spacer means for protecting the electrode from a reoxidation, the spacer means comprising silicon nitride or an amorphous silicon film and being deposited on the sidewalls of the electrode and not on the first layer of oxide.

12. The semiconductor device of claim 8 wherein the feature further comprises a dielectric on the one or more layers of conductive materials.

13. The semiconductor device of claim 8 wherein the second layer of oxide comprises a smile effect at a boundary between the feature and the first layer of oxide.

14. An electronic device comprising:

a first layer of oxide;

an electrode including polysilicon, a refractory metal, and a dielectric over the first layer of oxide, the electrode having sidewalls;

a boundary between the first layer of oxide and the electrode; and a spacer comprising silicon nitride or an amorphous silicon film only on the sidewalls of the electrode.

15. The electronic device of claim 14 wherein the spacer is deposited on the sidewalls of the electrode extending to and terminating at the boundary.

16. The electronic device of claim 14 wherein the first layer of oxide comprises a layer of gate oxide.

17. An electronic device comprising:

a first layer of oxide;

an electrode comprising undoped silicon over the first layer of oxide, the electrode having sidewalls;

a boundary between the first layer of oxide and the electrode; and a spacer comprising silicon nitride or an amorphous silicon film only on the sidewalls of the electrode.

18. The electronic device of claim 17 wherein the spacer is deposited on the sidewalls of the electrode extending to and terminating at the boundary.

19. The electronic device of claim 17 wherein the first layer of oxide comprises a layer of gate oxide.

20. The electronic device of claim 17, further comprising a second layer of oxide on the spacer and the first layer of oxide, the second layer of oxide comprising a smile effect at the boundary between the electrode and the first layer of oxide.

21. The semiconductor device of claim 6 wherein the feature further comprises a dielectric on the portion of conductive material.

22. The gate electrode of claim 9 wherein the feature includes polysilicon, a refractory metal, and a dielectric, or undoped silicon.

* * * * *

UNITED STATES PATENT AND TRADEMARK OFFICE
CERTIFICATE OF CORRECTION

PATENT NO.        : 7,009,264 B1                                         Page 1 of 1
APPLICATION NO. : 08/902809
DATED             : March 7, 2006
INVENTOR(S)       : Schuegraf et al.

It is certified that error appears in the above-identified patent and that said Letters Patent is hereby corrected as shown below:

On the title page, in field (56), under "Other Publications", in column 2, line 14, delete "pbulishing" and insert -- publishing --, therefor.

In column 1, line 54, delete "minire" and insert -- minimize --, therefor.

In column 1, line 63, delete "formiing" and insert -- forming --, therefor.

In column 3, line 46, after "when" insert -- electrode --.

In column 3, line 64, delete "sourceldrain" and insert -- source/drain --, therefor.

In column 4, line 7, delete "determiined" and insert -- determined --, therefor.

Signed and Sealed this

Fourth Day of July, 2006

JON W. DUDAS
*Director of the United States Patent and Trademark Office*